United States Patent
Oosawa et al.

(10) Patent No.: US 6,208,447 B1
(45) Date of Patent: Mar. 27, 2001

(54) OPTICAL RECEIVER

(75) Inventors: Katsuichi Oosawa, Osaka; Katsuhiko Oimura, Shiga, both of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/028,773

(22) Filed: Feb. 24, 1998

(30) Foreign Application Priority Data

Feb. 25, 1997 (JP) ................................... 9-040848

(51) Int. Cl.⁷ ................. H04B 10/06; H01L 31/075; H01L 31/06
(52) U.S. Cl. ................. 359/189; 359/189; 359/192; 257/458; 257/461
(58) Field of Search ................. 359/189; 257/435, 257/461, 465, 437, 458

(56) References Cited

U.S. PATENT DOCUMENTS

| | | | |
|---|---|---|---|
| 5,291,054 | * 3/1994 | Tanaka et al. | 257/433 |
| 5,365,087 | 11/1994 | Sasaki . | |
| 5,466,962 | * 11/1995 | Yamamoto et al. | 257/437 |

FOREIGN PATENT DOCUMENTS

| | | |
|---|---|---|
| 0566921A1 | 10/1993 | (EP) . |
| 61-286726 | 12/1986 | (JP) . |
| 62-092364 | 4/1987 | (JP) . |
| 63-1357 | 7/1988 | (JP) . |
| 63-217658 | 9/1988 | (JP) . |
| 01009655 | 1/1989 | (JP) . |
| 64002353 | 1/1989 | (JP) . |
| 01037061 | 2/1989 | (JP) . |
| 64-30861 | 2/1989 | (JP) . |
| 01089362 | 4/1989 | (JP) . |
| 01239876 | 9/1989 | (JP) . |
| 02275680 | 11/1990 | (JP) . |
| 03159180 | 7/1991 | (JP) . |
| 03203381 | 9/1991 | (JP) . |
| 4-40553 | 4/1992 | (JP) . |
| 04179168 | 6/1992 | (JP) . |

(List continued on next page.)

OTHER PUBLICATIONS

Patent Abstracts of Japan, vol. 007, No. 182 (E–192), Aug. 11, 1983 & JP 58 085563 A (Olympus Kogaku Kogy KK), May 21, 1983, Abstract.

Patent Abstracts of Japan, vol. 015, No. 036 (E–1027), Jan. 29, 1991 & JP 02 275680 A (NEC Corp.), Nov. 9, 1990, Abstract.

*Primary Examiner*—Jason Chan
*Assistant Examiner*—M. R. Sedighian
(74) *Attorney, Agent, or Firm*—McDermott, Will & Emery

(57) ABSTRACT

The present invention provides an improved optical receiver superior to conventional ones in photodetection sensitivity and capable of providing an increased receiving range for optical remote control receivers. A p-type semiconductor substrate and a light receiving section that is an n-type impurity region formed on the semiconductor substrate together form a photodiode. A first p-type impurity region is formed on the surface of the light receiving section and around the light receiving section. The first p-type impurity region overlying the light receiving section surface forms a shield section for providing protection against electromagnetic noise. This shield section partially covers the light receiving section surface for preventing an excessive occurrence of spontaneous noise due to contact with the light receiving section. Additionally, a second p-type impurity region formed deeper than the light receiving section is formed in such a way as to enclose the first p-type impurity region for providing protection against electromagnetic noise incident on the sideface of the semiconductor substrate.

10 Claims, 12 Drawing Sheets

U.S. PATENT DOCUMENTS

| | | |
|---|---|---|
| 04280685 | 10/1992 | (JP) . |
| 05013070 | 1/1993 | (JP) . |
| 0 566 921 | 10/1993 | (JP) . |
| 06005889 | 1/1994 | (JP) . |
| 6-69409 | 3/1994 | (JP) . |
| 06291356 | 10/1994 | (JP) . |
| 07030143 | 1/1995 | (JP) . |
| 7-10500 | 3/1995 | (JP) . |
| 07169990 | 7/1995 | (JP) . |

\* cited by examiner

OPTICAL RECEIVER

BACKGROUND OF THE INVENTION

This invention generally relates to optical receivers and it particularly pertains to the technology of optical receivers for use in optical remote control receivers operable to perform conversion of optical signals transmitted from the optical remote controller into electrical signals.

A typical optical remote control receiver is made up of an optical receiver, such as a photodiode (PD), operable to convert an optical signal into an electric current, and a peripheral circuit operable to convert a photocurrent produced in the optical receiver when light falls thereupon into a signal distinguishable by a logic circuit such as microcomputer.

Generally speaking, as the distance between the optical receiver and the transmitter, i.e., the receiving distance, increases, the optical receiver receives weaker light. Stated another way, as the photodetection sensitivity of an optical remote control receiver increases, its receiving range likewise increases. Conversely, as the photodetection sensitivity decreases, the receiving range likewise decreases. The long receiving range provides some advantages. For example, one advantage is that the transmitter may reduce its optical signal output for the electric battery to last for a longer time. Another advantage is that improvements in handling can be made.

Accordingly, there have been strong demands in the market for optical remote control receivers having a receiving range of 10 meters or more. Demand for high-performance optical receivers superior in photodetection sensitivity is therefore high.

Optical remote control receivers generally have domestic uses, which means that their photodetection sensitivity is greatly affected by the existence of electromagnetic noise from, for example, fluorescent lamps. In other words, the optical remote control receiver receives electromagnetic noise in addition to optical signals transmitted from a transmitter. The received optical signals are lost in the noise, leading to a drop of the photodetection sensitivity.

With a view to getting rid of such unwanted electromagnetic noise, various approaches have been made to optical receivers.

For example, Japanese Patent Application Laying Open Gazette No. 6-69409 shows a technique that the entirety of an optical receiver is shielded from electromagnetic noise by a metallic shell. Japanese Patent Application Laying Open Gazette No. 6-291356 shows a technique that a light-transmissive conductive film is formed on the surface of a light receiving section. Japanese Patent Application Laying Open Gazette No. 2-275680 shows a technique that the entire light receiving surface of a photodiode is shielded by a diffused region. Japanese Utility Model Application Laying Open Gazette No. 4-40553 shows a technique that only an area of the light receiving surface in the vicinity of a noise source is shielded by a diffused layer.

The above-listed prior art techniques are problematic in the following aspects. The technique of shielding the entirety of an optical receiver from electromagnetic noise is unattractive in the aspect of dimensions as well as in the aspect of costs. The technique of forming a light-transmissive conductive film on the light receiving surface is not attractive, either, for the reason that although the conductive film is a trans illuminous film its transmission rate is not 100%. Accordingly, there exist limits of improving the sensitivity of photodetection. Preferable dimensions, costs, and photodetection sensitivity would be best achieved by the technique of shielding a light receiving surface by a diffused layer.

Even such a technique is problematic. Although the technique may achieve a reduction of the effect of electromagnetic noise, such achievement will not much contribute to providing an improved photodetection sensitivity. It is hard to provide a receiving range in excess of 10 meters. Additionally, it is almost impossible to locate an electromagnetic noise source in general homes, and it is therefore practically impossible to shield only a near-noise source area of the light receiving surface by diffused layer.

Having conducted examinations based on experiments, the inventors of the present invention discovered that there occurs spontaneous noise in optical receivers due to the contact of a light receiving layer and a diffused layer used to shield the light receiving layer. Such spontaneous noise is a new bar to improvement in the optical receiver photodetection sensitivity.

SUMMARY OF THE INVENTION

Accordingly, an object of the present invention is to provide an optical receiver superior to conventional ones in photodetection sensitivity and capable of providing a longer receiving range for optical remote control receivers.

The present invention provides an optical receiver comprising:

a semiconductor substrate of one conductivity type; and a light receiving section which is an impurity region of opposite conductivity type formed in an upper surface area of said semiconductor substrate;

said optical receiver further comprising:

a first shield section which is an impurity region of said one conductivity type formed in an upper surface area of said light receiving section for providing protection against electromagnetic noise;

wherein said shield section is formed in such a way as to provide a partial covering of the upper surface of said light receiving section for preventing an excessive occurrence of spontaneous noise due to contact with said light receiving section.

In accordance with the present invention, the first shield section partially covers the surface of the light receiving section in order to prevent an excessive occurrence of spontaneous noise caused by contact with the light receiving section. As a result of such arrangement, spontaneous noise is not produced to such an extent that it becomes a bar to improving the sensitivity of photodetection of optical receivers. An improved photodetection sensitivity is achieved. The receiving range of optical remote control receivers can be increased. This allows a transmitter to reduce its output for the electric battery to last for a longer time and makes improvements in handling.

In the foregoing optical receiver, it is preferred that a second shield section of an impurity region of the one conductivity type is formed around the light receiving section in the semiconductor substrate upper surface area.

As a result of such arrangement, electromagnetic noise incident on upper surface areas of the semiconductor substrate other than the light receiving section upper surface can be shielded by the second shield section.

It is preferred that the first and second shield sections are electrically connected with each other.

Such arrangement eliminates the need for providing a shield electrode for connecting the first shield section to ground on the first shield section, which allows the shield electrode to be formed on the second shield section. As a result, the upper surface of the light receiving section is not light-shielded. The upper surface of the light receiving section is effectively used as a light receiving surface.

It is preferred that the second shield section has a lateral shield portion which is formed deeper than the light receiving section.

As a result of such arrangement, electromagnetic noise incident on the sideface of the light receiving section can be cut off by the lateral shield portion formed deeper than the light receiving section.

It is preferred that a contact layer which is an impurity region of the one conductive type is formed in a lower surface of the semiconductor substrate, wherein almost all of the lower surface of the semiconductor substrate is bonded to a lead with a conductive adhesive.

As a result of such arrangement, electromagnetic noise incident upon the lower surface of the semiconductor substrate is positively cut off by the lead.

It is preferred that at least a lower part of the sideface of the semiconductor substrate is covered with the conductive adhesive.

As a result of such arrangement, electromagnetic noise incident upon the sideface of the semiconductor substrate is positively cut off by the conductive adhesive.

The present invention provides an optical receiver comprising a semiconductor substrate of one conductivity type and a light receiving section which is an impurity region of opposite conductivity type formed in an upper surface area of said semiconductor substrate, said optical receiver further comprising:

a first shield section which is an impurity region of said one conductivity type formed in an upper surface area of said light receiving section; and a second shield section which is an impurity region of said one conductivity type formed around said light receiving section in said semiconductor substrate upper surface area;

wherein said second shield section has a lateral shield portion formed to be deeper than said light receiving section.

As a result of such arrangement, electromagnetic noise incident on the sideface of the light receiving section can be cut off by the lateral shield portion formed deeper than the light receiving section.

The present invention provides an optical receiver comprising a semiconductor substrate of one conductivity type and a light receiving section which is an impurity region of opposite conductivity type formed in an upper surface area of said semiconductor substrate, said optical receiver further comprising:

a shield section which is an impurity region of said one conductivity type formed in an upper surface area of said light receiving section; and a contact layer which is an impurity region of said one conductivity type formed in a lower surface area of said semiconductor substrate;

wherein:
  almost all of the lower surface of said semiconductor substrate is bonded to a lead with a conductive adhesive; and
  a lower part of the sideface of said semiconductor substrate is covered with said conductive adhesive.

As a result of such arrangements, electromagnetic noise incident on the lower surface of the semiconductor substrate is positively cut off by the lead and electromagnetic noise incident upon the sideface of the semiconductor substrate is positively cut off by the conductive adhesive.

DETAILED DESCRIPTION OF THE INVENTION

Preferred embodiments of this invention will be described with reference to the accompanying drawing figures. Through the following description, whereas one conductive type is p-type, the other conductive type is n-type.

FIRST EMBODIMENT

Figure 1:
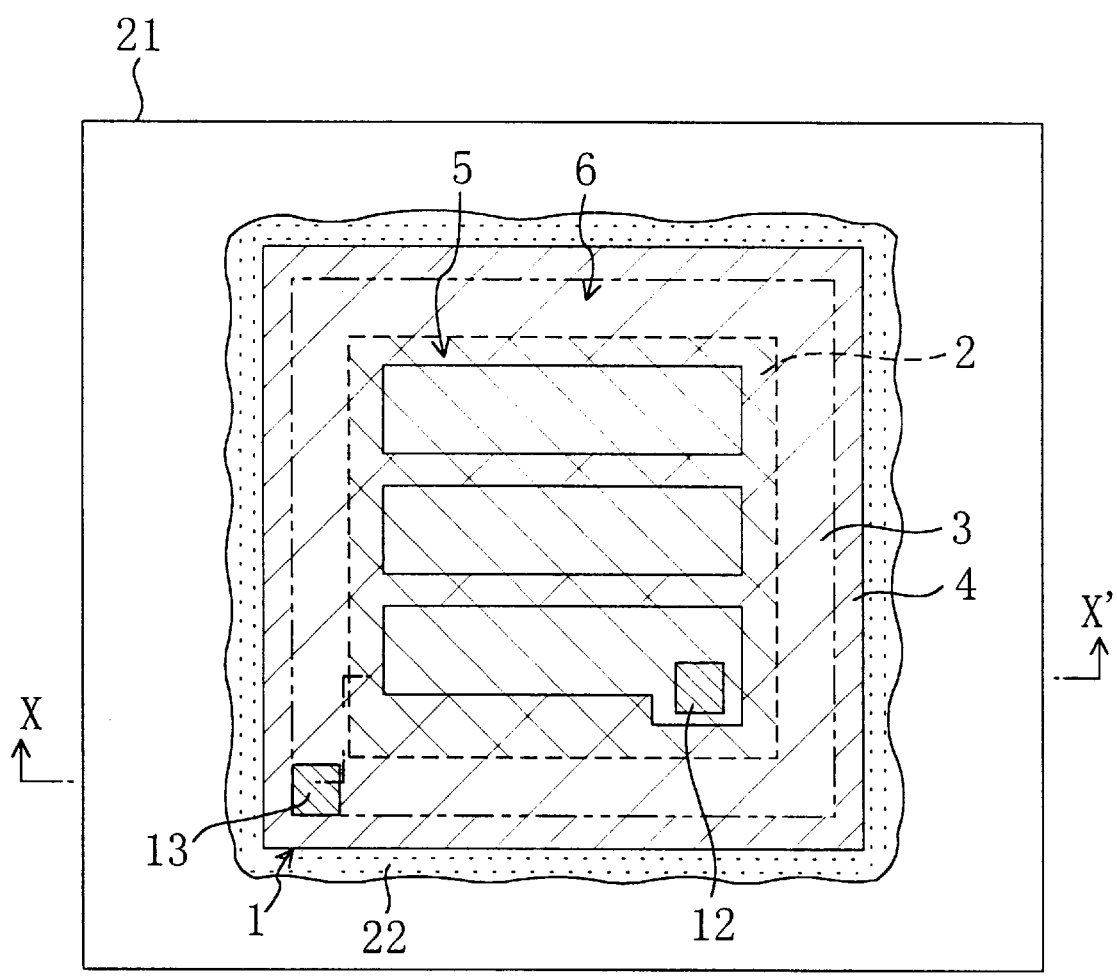
FIG. 1 is a plane view of the organization of an optical receiver of a first embodiment of the present invention.
Figure 2:
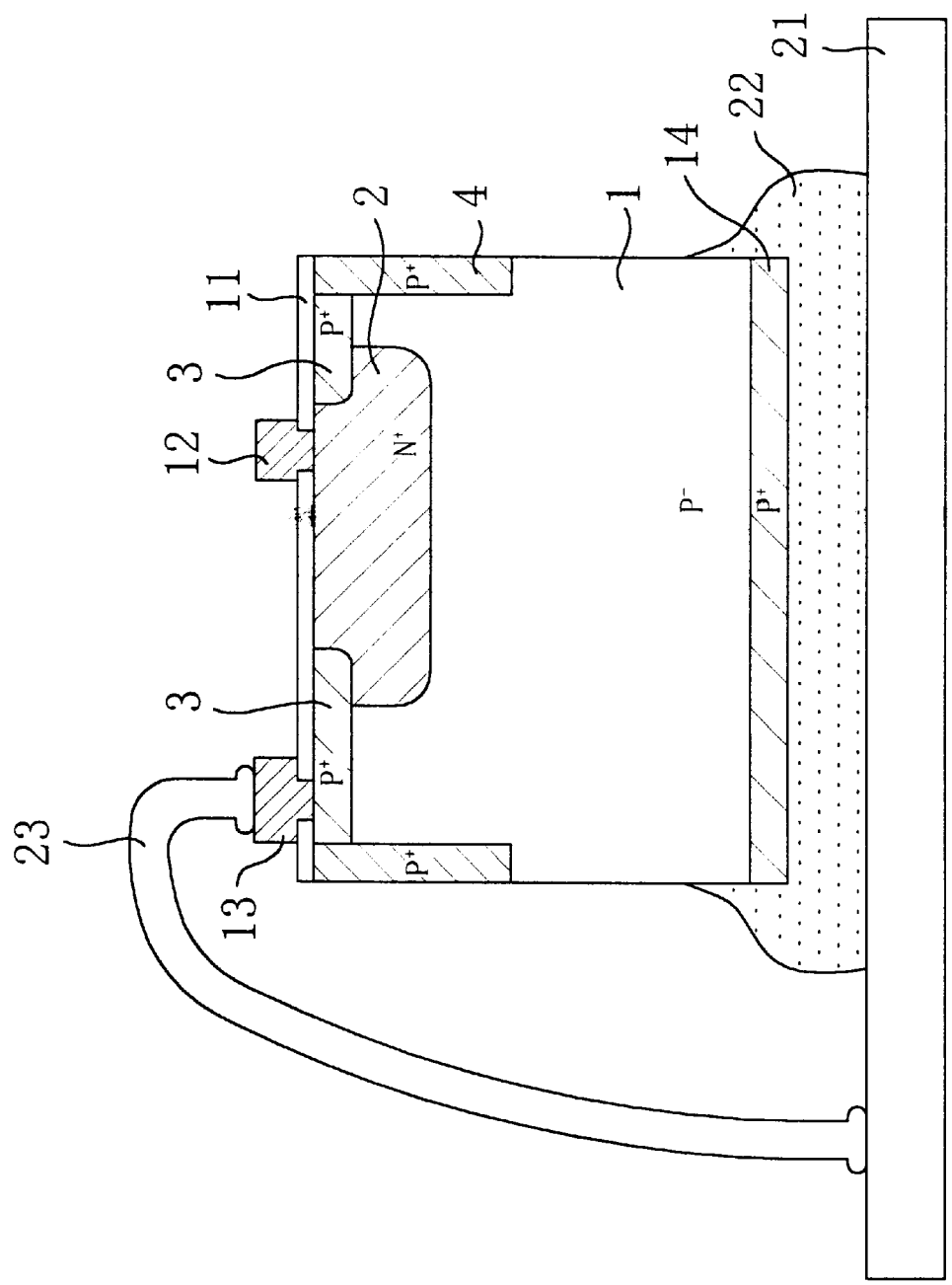
FIG. 2 is a cross-sectional view of the organization of the optical receiver of the first embodiment of the present invention.

Reference is first made to FIG. 1 which shows in plane the organization of an optical receiver in accordance with a first embodiment of the present invention. FIG. 2 is a cross-sectional view of the FIG. 1 optical receiver taken along line X–X'. For the sake of simplifying the description, the line X–X' is shown not in the form of a straight line but in the form of a bending line in order that it may pass through both a cathode electrode 12 and an anode electrode 13.

Referring to FIGS. 1 and 2, therein shown is a p-type semiconductor substrate 1 (dimensions: 1.50 mm by 1.50 mm; thickness: 350 micrometers). The semiconductor substrate 1 has been phosphorus-doped to a doping level of $10^{-13}$ cm$^{-3}$. A light receiving section 2 is formed overlying the semiconductor substrate 1. The light receiving section 2 is formed of an n-type impurity region (dimensions: 1.35 mm by 1.35 mm; depth: 5 micrometers) which has been boron-doped to a doping level of $10^{-15}$ cm$^{-3}$.

The semiconductor substrate 1 and the light receiving section 2 together form a photodiode (PD). Whereas the semiconductor substrate 1 operates as an anode for the PD, the light receiving section 2 operates as a cathode for the PD.

A first p-type impurity region 3 and a second p-type impurity region 4, both of which have been phosphorus-doped to a doping level of $10^{-18}$ cm$^{-3}$, are formed overlaying the semiconductor substrate 1. The first p-type impurity region 3 is formed to a depth of 2 micrometers in order that it may not only provide a partial covering of the upper surface of the light receiving section 2 in a lattice likepattern but also enclose the surface of the light receiving section 2. On the other hand, the second p-type impurity region 4, as a lateral shield portion, is formed in an area of the sideface of the semiconductor substrate 1 to a depth in excess of that of the light receiving section 2 (5 micrometers) in order that the region 4 may enclose the region 3. A portion, formed in the surface of the light receiving section 2, of the first p-type impurity region 3 constitutes a first shield section 5. A portion, not formed in the surface of the light receiving section 2, of the first p-type impurity region 3 and the second p-type impurity region 4 together constitute a second shield section 6. Connected to ground, each of the first and second shield sections 5 and 6 may operate as a shield for providing protection against external electromagnetic noise.

Additionally, formed on the semiconductor substrate 1 is a protective film 11 (not shown in FIG. 1) made up of multiple films including a silicon nitride film (LP-SiN) formed by an LP-CVD (low-pressure chemical vapour deposition) process. The LP-SiN film is formed by LP-CVD, thereby causing no damage to the surface of the light receiving section 2 when formed. In addition, the LP-SiN film is closely deposited therefore enhancing the protective function. This produces the advantage that the thickness of the protective film 11 can be made thinner than that of conventional ones, therefore making it possible for the protective film 11 to have a light reflection preventive function. The thickness of the protective film 11 is determined according to the wavelength of light. For example, an LP-SiN film is deposited having a film thickness ranging from 400 to 1000 Å. This is followed by formation of a silicon dioxide (SiO$_2$) film having a film thickness ranging from 200 to 400 Å on the LP-SiN film.

The cathode electrode 12 disposed to establish connection between the light receiving section 2 and the peripheral circuit is provided at an area of the surface of the light receiving section 2 where the first shield section 5 is not formed. On the other hand, the anode electrode 13 disposed to establish connection between the semiconductor substrate 1 and the peripheral circuit is provided on the surface of the second shield section 6. Formed on an area of the lower surface of the semiconductor substrate 1 is a contact layer 14 formed of a third p-type impurity region. Almost all of the lower surface of the semiconductor substrate 1 is bonded by a conductive adhesive 22, such as Ag paste, soldering, and conductive resin, to a die pad 21 acting as a lead. The area of the surface of the die pad 21 is greater than that of the lower surface of the semiconductor surface 1. The conductive adhesive 22 climbs up along the sideface of the semiconductor substrate 1 by virtue of surface tension, as a result of which at least a part of the lower sideface of the semiconductor substrate 1 is covered with the conductive adhesive 22.

The anode electrode 13 is wire-bonded by a bonding wire 23 to the die pad 21, which is not shown in FIG. 1. As a result of such arrangement, the first shield section 5 is electrically connected to the die pad 21 by the second shield section 6, the anode electrode 13, and the bonding wire 23 and to ground. With respect to the cathode electrode 12, its wire bonding is not shown.

Figure 3:
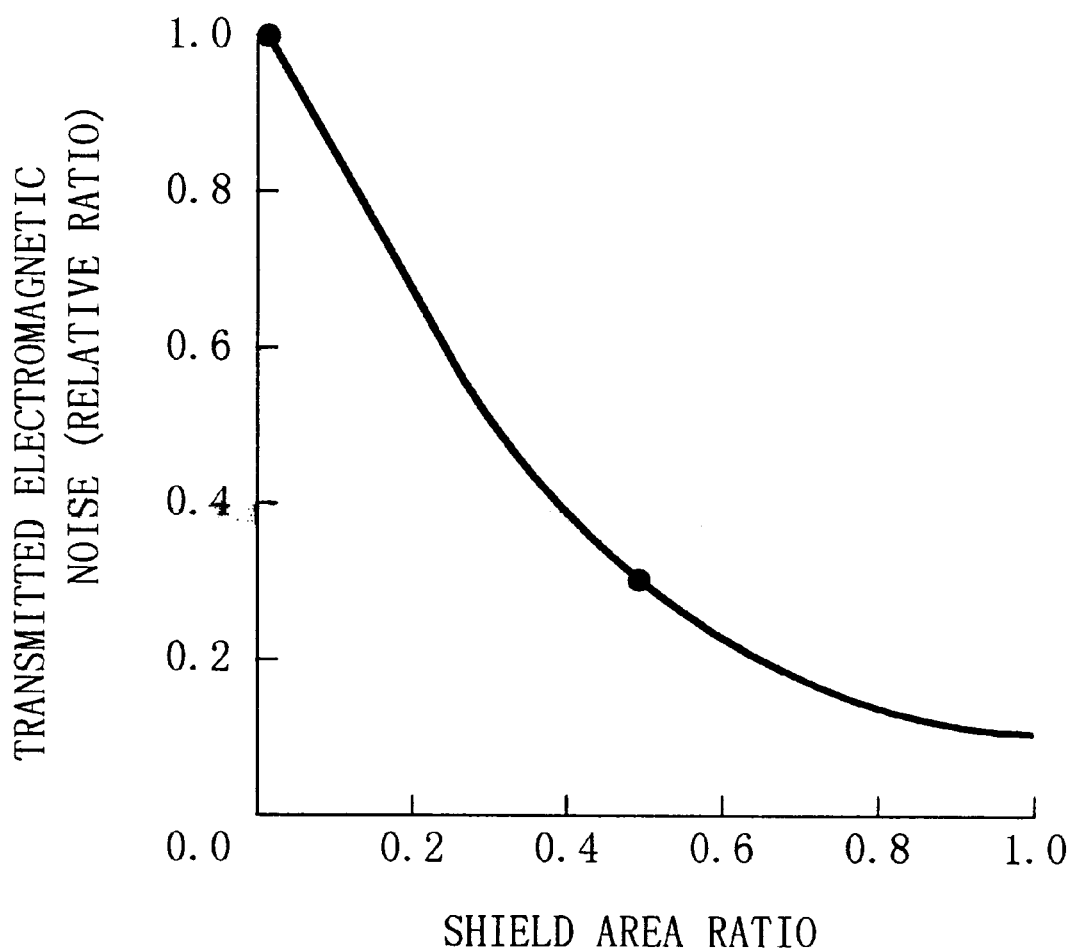
FIG. 3 graphically shows a relationship between the amount of transmitted electromagnetic noise and the shield area ratio in the optical receiver of the first embodiment of the present invention.

FIG. 3 is a graph showing a relationship between the amount of transmitted electromagnetic noise incident upon the light receiving section 2 after passing through the first shield section 5 and the area, occupied by the first shield section 5 in the surface of the light receiving section 2, for the optical receiver of the present embodiment. In FIG. 3, the ordinate indicates the transmitted electromagnetic noise amount expressed by relative ratio in which the relative ratio 1 is when the first shield section 5 is not formed in the surface of the light receiving section 2 at all, while on the other hand the abscissa indicates the shield area ratio, i.e., the ratio of an area, occupied by the first shield section 5 5 in the surface of the light receiving section 2, to the entire surface area of the light receiving section 2.

As can be seen from FIG. 3, as the shield area ratio increases, external electromagnetic noise finds it easier to escape to ground through the first shield section 5, resulting in a decrease in the transmitted electromagnetic noise amount. This means that as the surface of the first shield section 5 increases the photodetection sensitivity of optical receivers likewise increases, provided that there exists no noise except for external electromagnetic noise.

However, in practice there occurs spontaneous noise due to contact between the light receiving section 2 and the first shield section 5. Because of this, if the area of the surface of the first shield section 5 is too large, this results in a reduction of the photodetection sensitivity of optical receiver due to such spontaneous noise, instead of an increase in the photodetection sensitivity.

Figure 4:
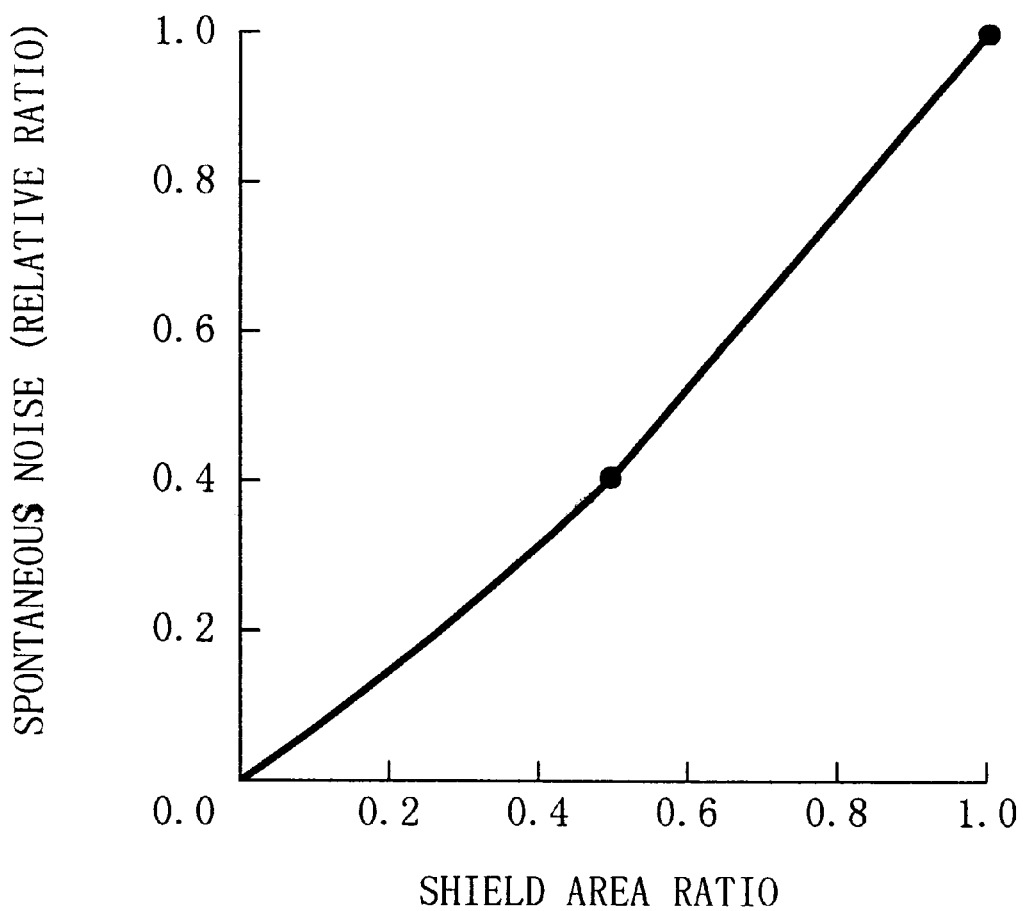
FIG. 4 graphically shows a relationship between the amount of spontaneous noise and the shield area ratio in the optical receiver of the first embodiment of the present invention.

FIG. 4 is a graph showing a relationship between the amount of spontaneous noise due to contact of the light receiving section 2 and the first shield section 5 and the area, occupied by the first shield section 5 in the surface of the light receiving section 5, for the optical receiver of the present embodiment. In FIG. 4, the ordinate indicates the spontaneous noise amount in which the relative ratio 1 is when the first shield section 5 is formed all over the light receiving section 2, while on the other hand the abscissa indicates the shield area ratio.

FIG. 4 shows that as the shield area ratio decreases the amount of spontaneous noise likewise decreases. When the first shield section 5 is not formed over the surface of the light receiving section 2 at all, the photodetection sensitivity is increased to a maximum and the receiving range, when used as an optical remote control receiver, increases to a maximum, in situations in which there exists no external electromagnetic noise.

For such a reason, in the present embodiment the first shield section 5 is partially formed in the surface of the light receiving section 2 in order that too much spontaneous noise due to contact with the light receiving section 2 may not occur (see FIG. 1). As a result of such arrangement, the present optical receiver has a stronger strength against external electromagnetic noise than one without a shield section in the surface of the light receiving section 2. Additionally, in accordance with the present optical receiver, the occurrence of spontaneous noise can be reduced to a lesser extent than one with a shield section in the entire surface of the light receiving section 2. The present optical receiver therefore achieves not only higher photodetection sensitivity in comparison with conventional ones but also a greater receiving range when used as an optical remote control receiver.

Figure 5:
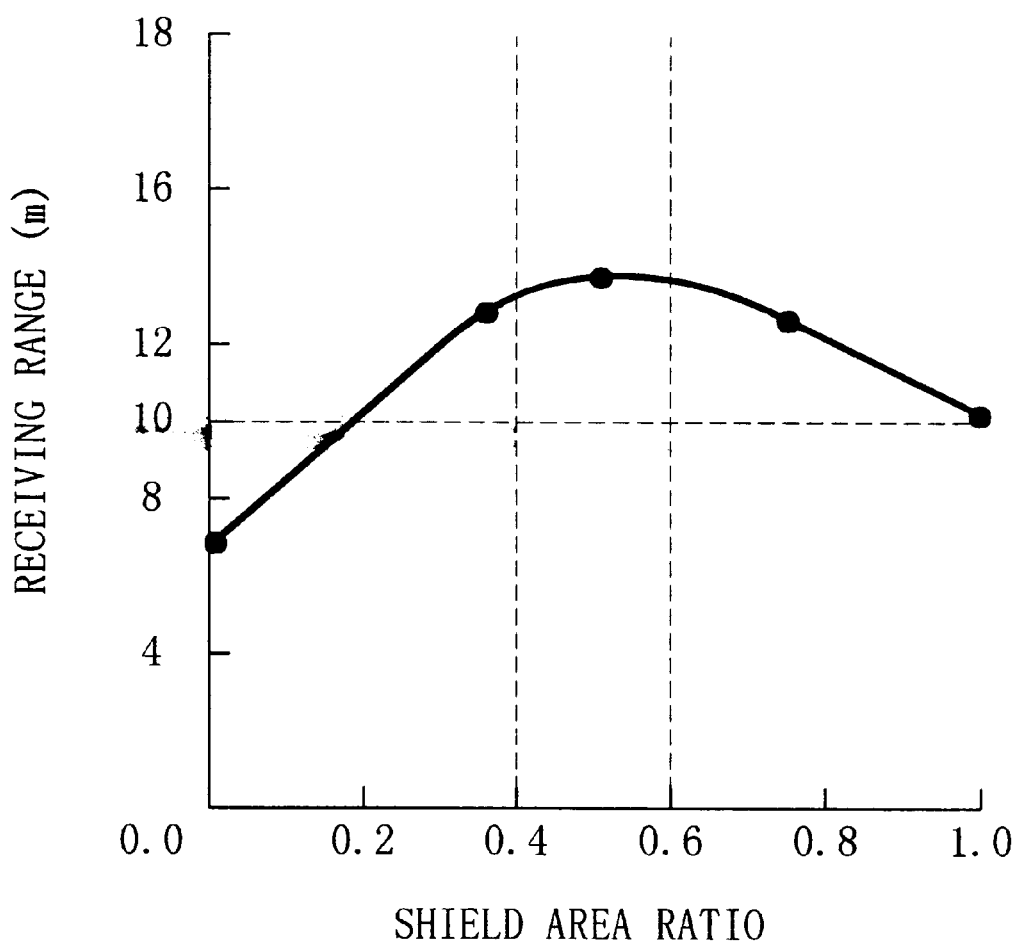
FIG. 5 graphically shows a relationship between the receiving range and the shield area ratio in the event of using the optical receiver of the first embodiment of the present invention as an optical remote control receiver.

FIG. 5 is a graph showing the results of experiments on the operation of the optical receiver of FIGS. 1 and 2 used as an optical remote control receiver in a normal room environment with the presence of electromagnetic noise, and shows the relationship between the receiving range of the optical remote control receiver and the area, taken up by the first shield section 5 in the surface of the light receiving section 2. In the graph shown by FIG. 5, the ordinate indicates the receiver's receiving range (m) and the abscissa indicates the shield area ratio.

It follows from FIG. 5 that the receiving range is around 7 meters when the shield area ratio is zero, that is, when the first shield section 5 is not formed in the surface of the light receiving section 2 at all. When the first shield section 5 is formed all over the light receiving section 2, i.e., when the shield area ratio is 1.0, the receiving range is increased to around 10 meters. If the shield area ratio is made to range from 0.25 to 0.95, this makes it possible to achieve a longer receiving range in excess of 10 meters. Stated another way, the shield area ratio from 0.25 to 0.95 provides more improved photodetection sensitivity than conventional optical receivers having a light receiving section whose entire surface is covered with a shield section. When the shield area ratio is set at 0.5, the optical receiver photodetection sensitivity reaches its maximum, and the receiving range of the optical remote control receiver likewise reaches its maximum, 13 meters. This is because that the sum of the amount of transmitted electromagnetic noise and the amount of spontaneous noise is minimized. In practice, the setting of the shield area ratio at from 0.4 to 0.6 produces a most desirable photodetection sensitivity.

In addition to the technical characteristic of the present embodiment that the first shield section 5 is formed in such a way as to partially cover the surface of the light receiving section 2, the optical receiver of the present embodiment has some other technical characteristics as follows.

The second shield section 6 is formed around the light receiving section 2 in the surface area of the semiconductor substrate 1. Because of such arrangement, electromagnetic noise incident on the surface of the semiconductor substrate 1 other than the surface of the light receiving section 2 can be cut off by the presence of the second shield section 6. The second shield section 6 includes, as its lateral shield portion, the second p-type impurity region 4 formed deeper than the light receiving section 2. As a result of such arrangement, electromagnetic noise incident upon the sideface of the light receiving section 2 can be cut off by the presence of the second shield section 6. The second p-type impurity region 4 is formed in the sideface area of the semiconductor substrate 1 in the present embodiment. The second p-type impurity region 4 is not necessarily flush with the sideface of the semiconductor substrate 1.

Since the first shield section 5 is electrically connected to the second shield section 6 and is connected to ground through the anode electrode 13, this eliminates the need of additionally providing a shield electrode on the surface of the light receiving section 2. This prevents the surface of the light receiving section 2 from being shielded by a shield electrode and the surface of the light receiving section 2 is more effectively used as a light receiving surface.

Further, electromagnetic noise from the bottom of the semiconductor substrate 1 can be cut off positively by the presence of the die pad 21. The conductive adhesive 22 climbs up along the sideface of the semiconductor substrate 1 by surface tension thereby contributing to shielding the sideface of the semiconductor substrate 1 from electromagnetic noise. The effect of providing protection against electromagnetic noise by the conductive adhesive 22 becomes significant when it climbs up to above the top of the contact layer 14, that is when the sideface of the contact layer 14 is covered with the conductive adhesive 22.

SECOND EMBODIMENT

Figure 6:
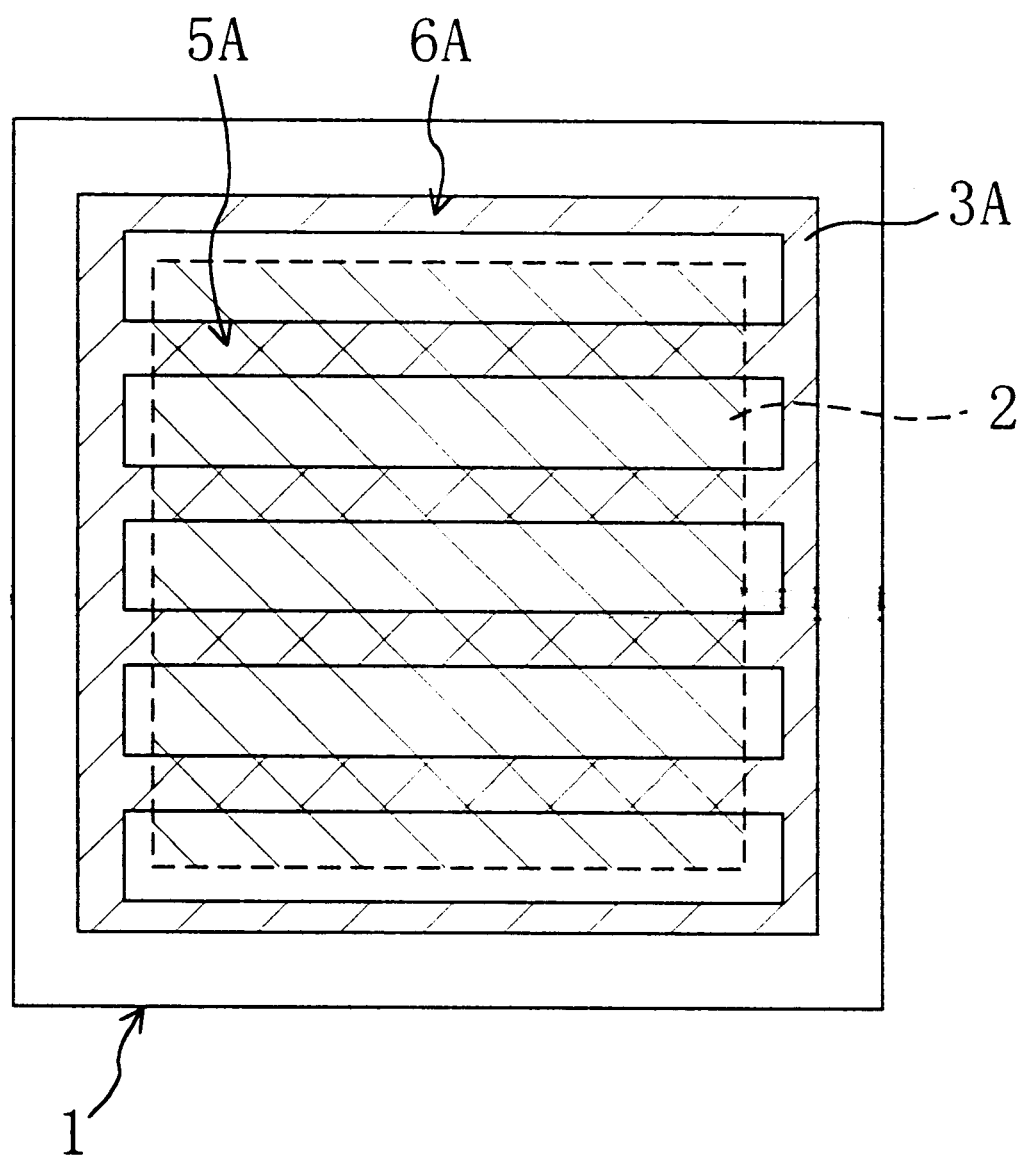
FIG. 6 is a plane view of the organization of an optical receiver of a second embodiment of the present invention.

FIG. 6 is a plane view showing the organization of an optical receiver in accordance with a second embodiment of the present invention. Formed on the semiconductor substrate 1 is a p-type impurity region 3A that has been phosphorus-doped to a doping level of $10^{-18}$ $cm^{-3}$. More specifically, the p-type impurity region 3A is formed to a depth of 2 micrometers in such a way as to partially cover the surface of the light receiving section 2 in a latticelike pattern and to enclose the surface of the light receiving section 2. Connected to ground, the p-type impurity region 3A may operate as a shield for providing protection against external electromagnetic noise. Whereas, an area, formed within the surface of the light receiving section 2, of the p-type impurity region 3A, constitutes a first shield section 5A, an area, formed without the surface of the light receiving section 2, of the p-type impurity region 3A constitutes a second shield section 6A. The second embodiment differs from the first embodiment in that the second p-type impurity region 4 is not provided, and the second shield section 6A does not extend to the sideface of the semiconductor substrate 1. Neither the anode electrode nor the cathode electrode is shown in FIG. 6.

Figure 7:
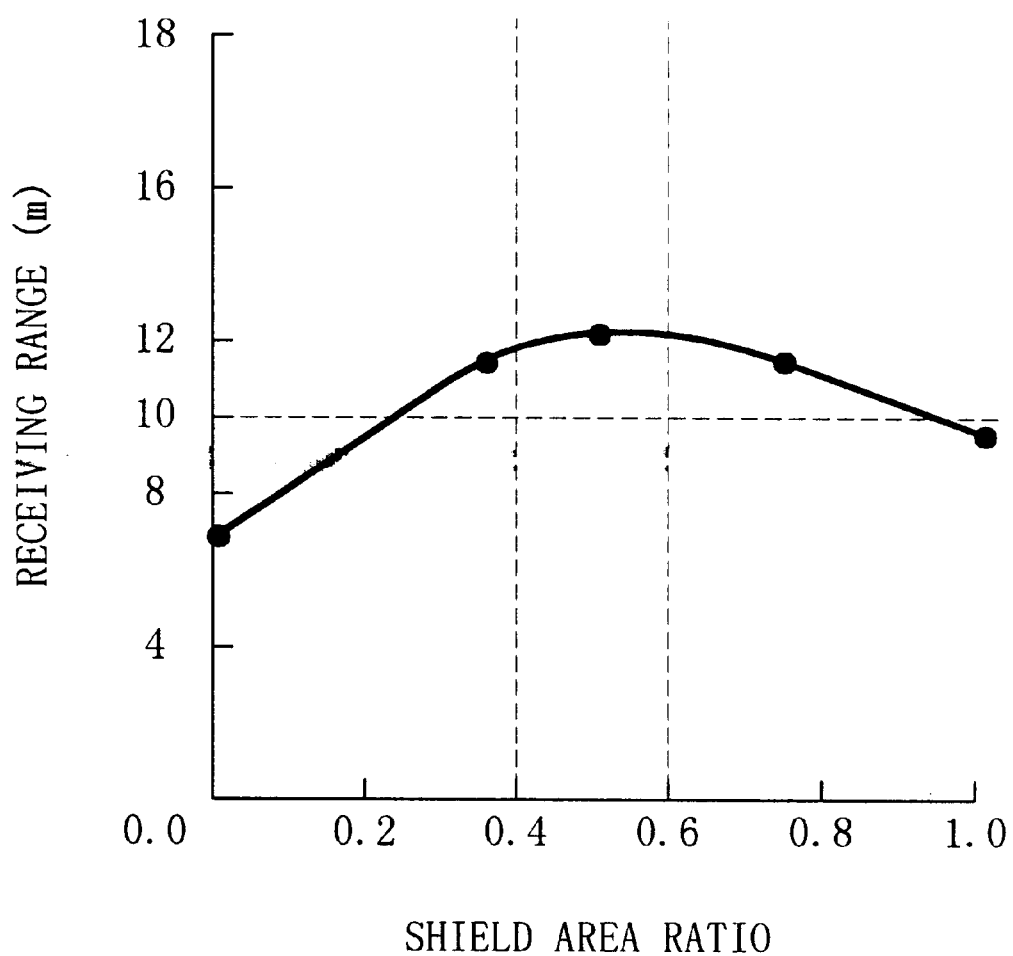
FIG. 7 graphically shows a relationship between the receiving range and the shield area ratio in the event of using the optical receiver of the second embodiment of the present invention as an optical remote control receiver.

FIG. 7 is a graph showing the results of experiments on the operation of the optical receiver of FIG. 6 used as an optical remote control receiver in a normal room environment with the presence of electromagnetic noise, and shows the relationship between the receiving range of the optical remote control receiver and the area occupied by the first shield section 5A in the surface of the light receiving section 2. In the graph shown by FIG. 7, the ordinate indicates the receiver's receiving range (m) and the abscissa indicates the shield area ratio, that is, the ratio of the area, taken up by the first shield section 5A in the surface of the light receiving section 2, to the entire surface area of the light receiving section 2.

If the shield area ratio is made to range from 0.25 and 0.95, this ensures a receiving range of 10 meters or more. If the shield area ratio is made to range from 0.35 and 0.70, then the effects of spontaneous noise and electromagnetic noise are further reduced thereby making it possible to ensure a receiving range of 11 meters or more. If the shield area ratio is made to be 0.5, the photodetection sensitivity is maximized thereby improving the receiving range to a maximum, approximately 12 meters. This is because that the sum of the amount of transmitted electromagnetic noise and the amount of spontaneous noise is minimized. In practice, the setting of the shield area ratio at from 0.4 to 0.6 produces a most desirable photodetection sensitivity.

THIRD EMBODIMENT

Figure 8:
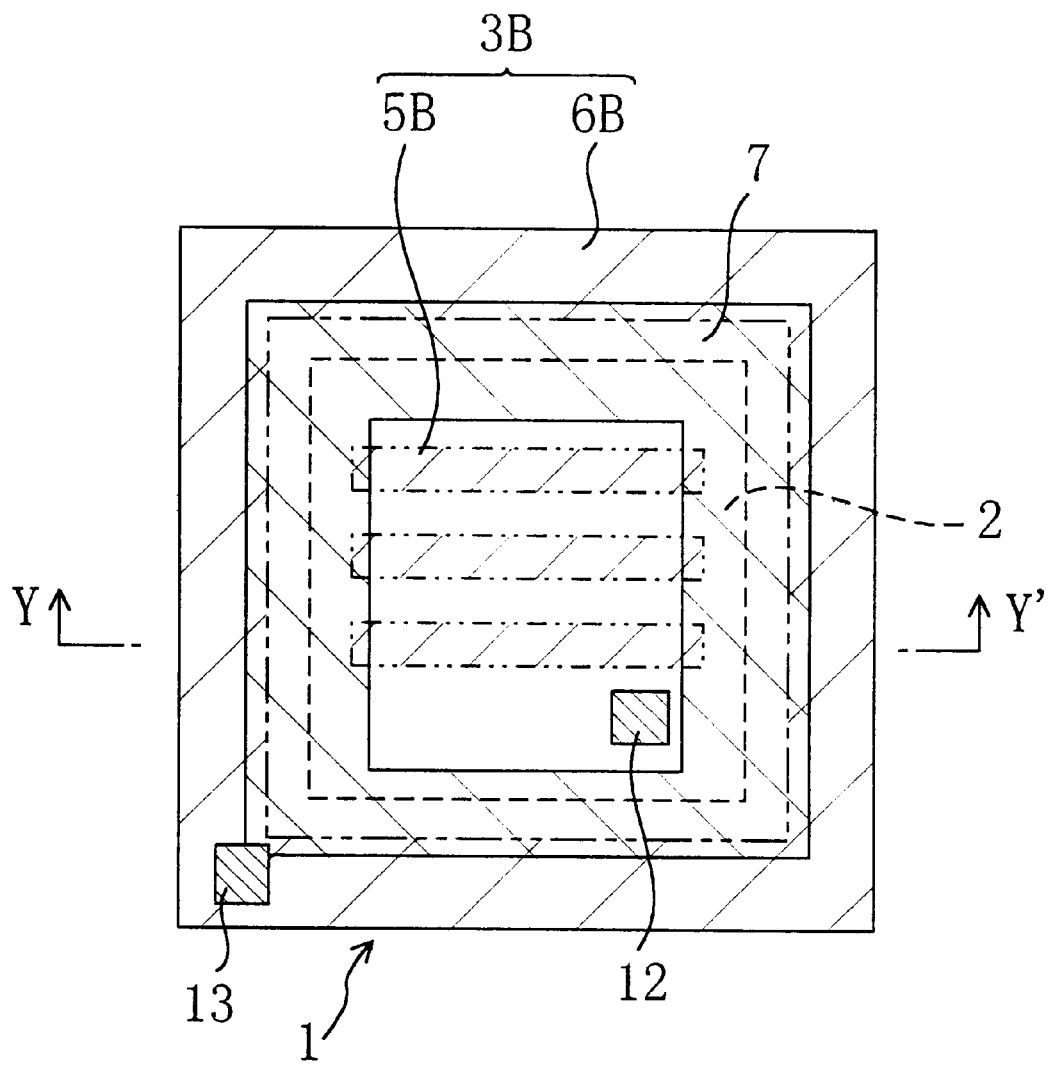
FIG. 8 is a plane view of the organization of an optical receiver of a third embodiment of the present invention.
Figure 9:
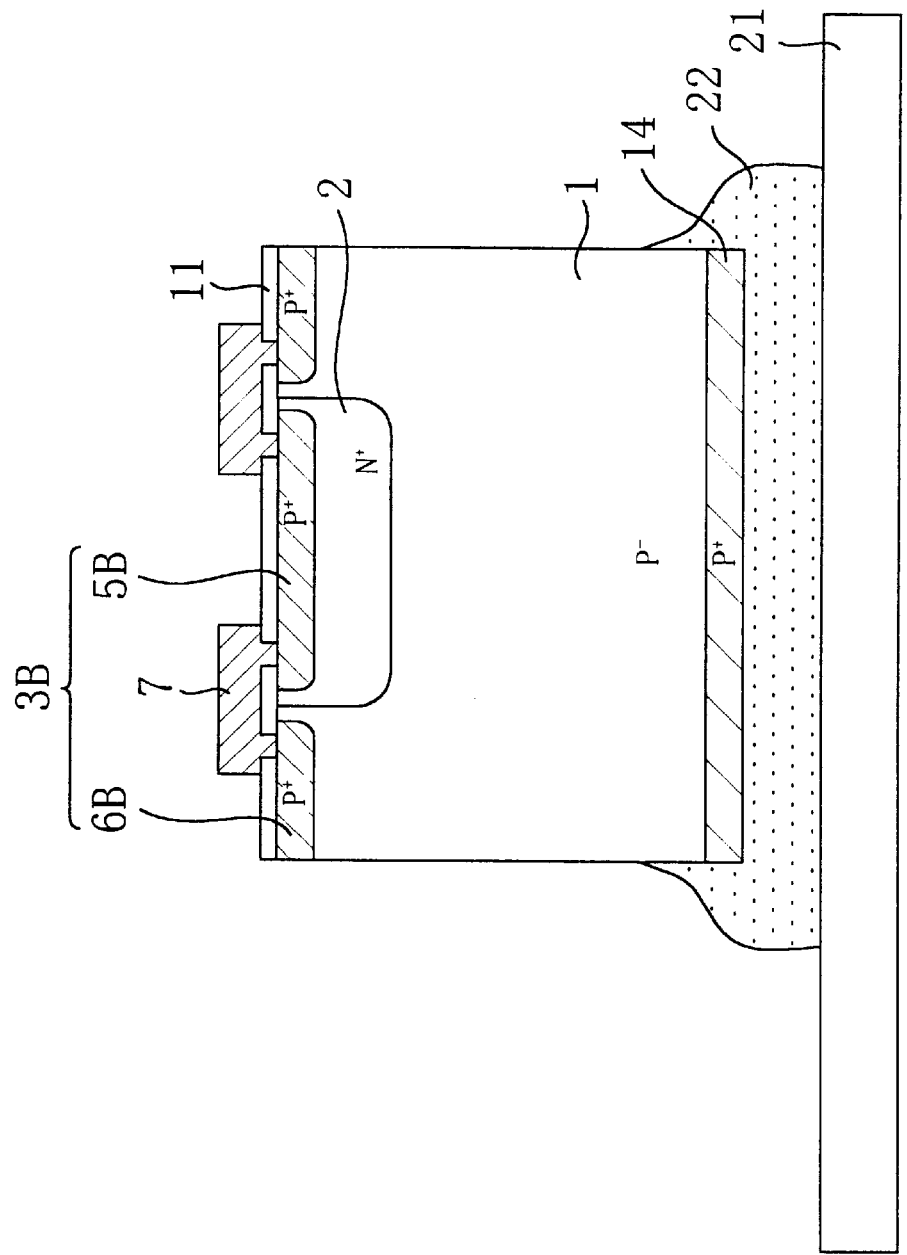
FIG. 9 is a cross-sectional view of the organization of the optical receiver of the third embodiment of the present invention shown in FIG. 8.

FIG. 8 is a plane view of the organization of an optical receiver in accordance with a third embodiment of the present invention. FIG. 9 is a cross-sectional view taken along line Y–Y' of the light receiver of FIG. 8.

As shown in FIGS. 8 and 9, the light receiving section 2, which is an n-type impurity region, is formed in a surface area of the p-type semiconductor substrate 1. A p-type impurity region 3B of a first sub-region and a second sub-region, which has been phosphorus-doped to a doping level of $10^{-18}$ cm$^{-3}$, is formed to a depth of 2 micrometers in the semiconductor substrate 1. More specifically, the first sub-region is formed so as to partially cover the surface of the light receiving section 2 in a latticelike pattern and the second sub-region is formed so as to enclose the surface of the light receiving section 2. Connected to ground, the p-type impurity region 3B operates as a shield for providing protection against electromagnetic noise. Whereas, an area of the p-type impurity region 3B, formed within the surface of the light receiving section 2, i.e., the first sub-region, constitutes a first shield section 5B, an area of the p-type impurity region 3B, formed without the surface of the light receiving section 2, i.e., the second sub-region, constitutes a second shield section 6B.

In the first embodiment, the first and second shield sections 5 and 6 are integrally formed by the first impurity region 3. In the present embodiment, however, the first and second shield sections 5B and 6B are electrically connected together by an aluminum wiring film 7 as a metallic wire formed over the semiconductor substrate 1. As a result of such arrangement, the first shield section 5B is connected to ground through the anode 13 formed on the second shield section 6B. This prevents the surface of the light receiving section 2 from being shielded by shield electrode and the surface of the light receiving section 2 is more effectively used as a light receiving surface.

In the present embodiment, the Al wiring film 7 is formed in such a manner as to cover the boundary of the light receiving section 2 over almost all of the circumference thereof. The wiring film 7 therefore has the function to provide protection against external electromagnetic noise.

Figure 10:
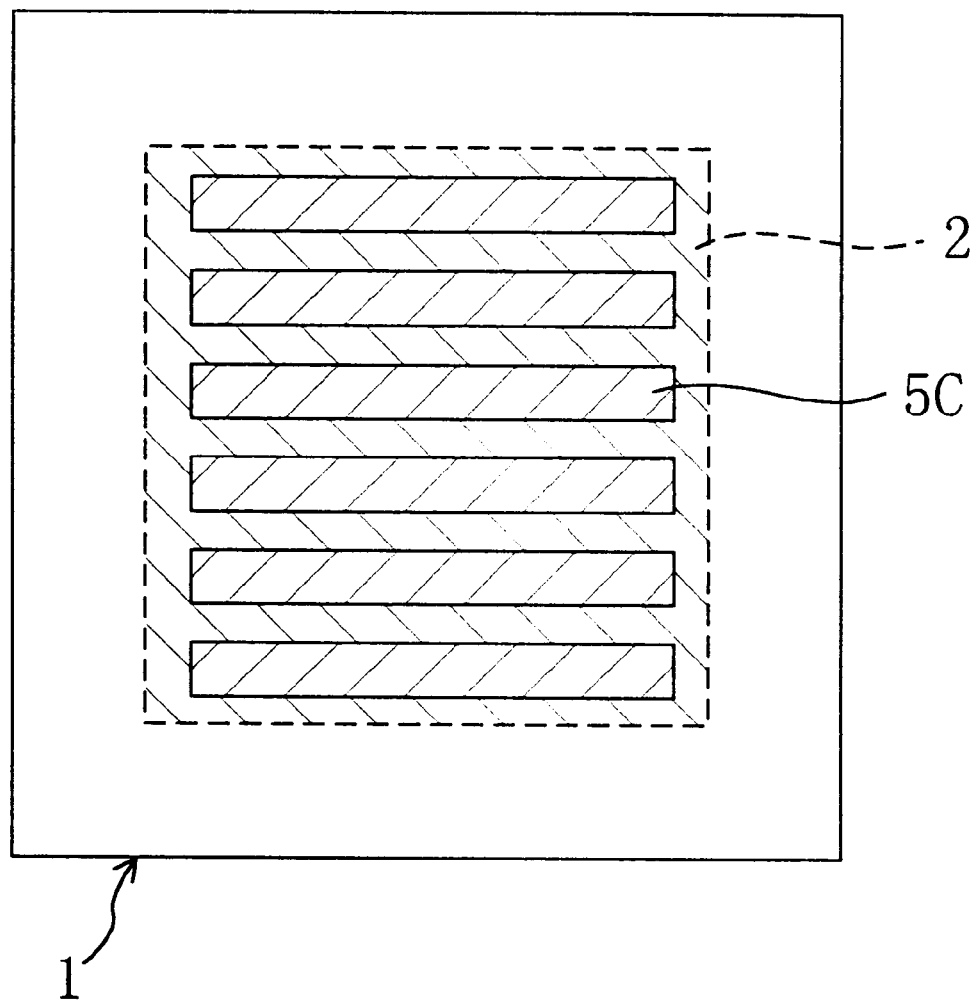
FIG. 10 is a plane view showing an example of an optical receiver in which a shield section is formed only in the light receiving section surface.

In the foregoing embodiments of the present invention, the second shield sections 6, 6A, and 6B for providing protection against electromagnetic noise are formed around the light receiving section 2 in the surface of the semiconductor substrate 1. The organization that a shield section is formed only in an area of the surface of the light receiving section 2 may be used. FIG. 10 shows in plane an example of an optical receiver in which a shield section 5C is formed, only in a surface area of the light receiving section 2.

Figure 11:
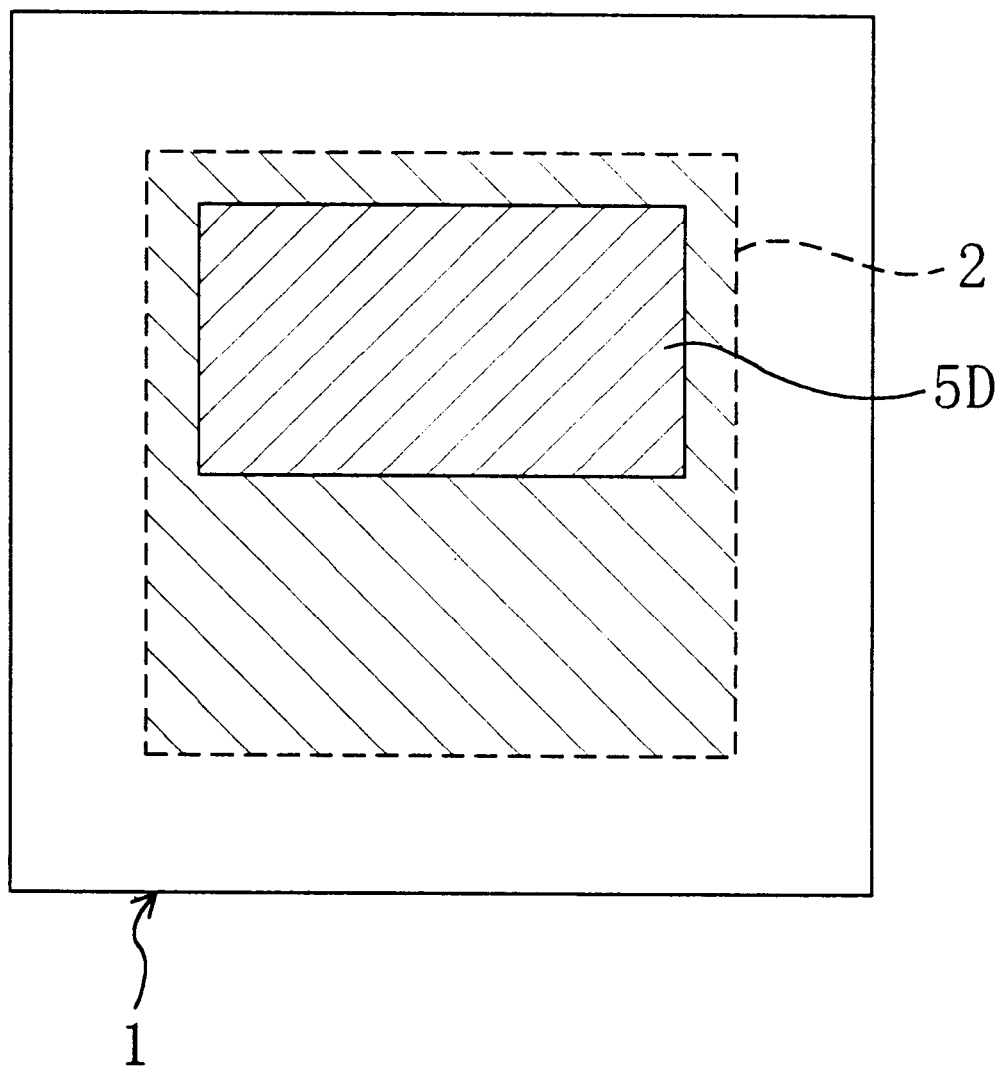
FIG. 11 is a plane view of an optical receiver in which a rectangular shield section is formed in the light receiving section surface.
Figure 12:
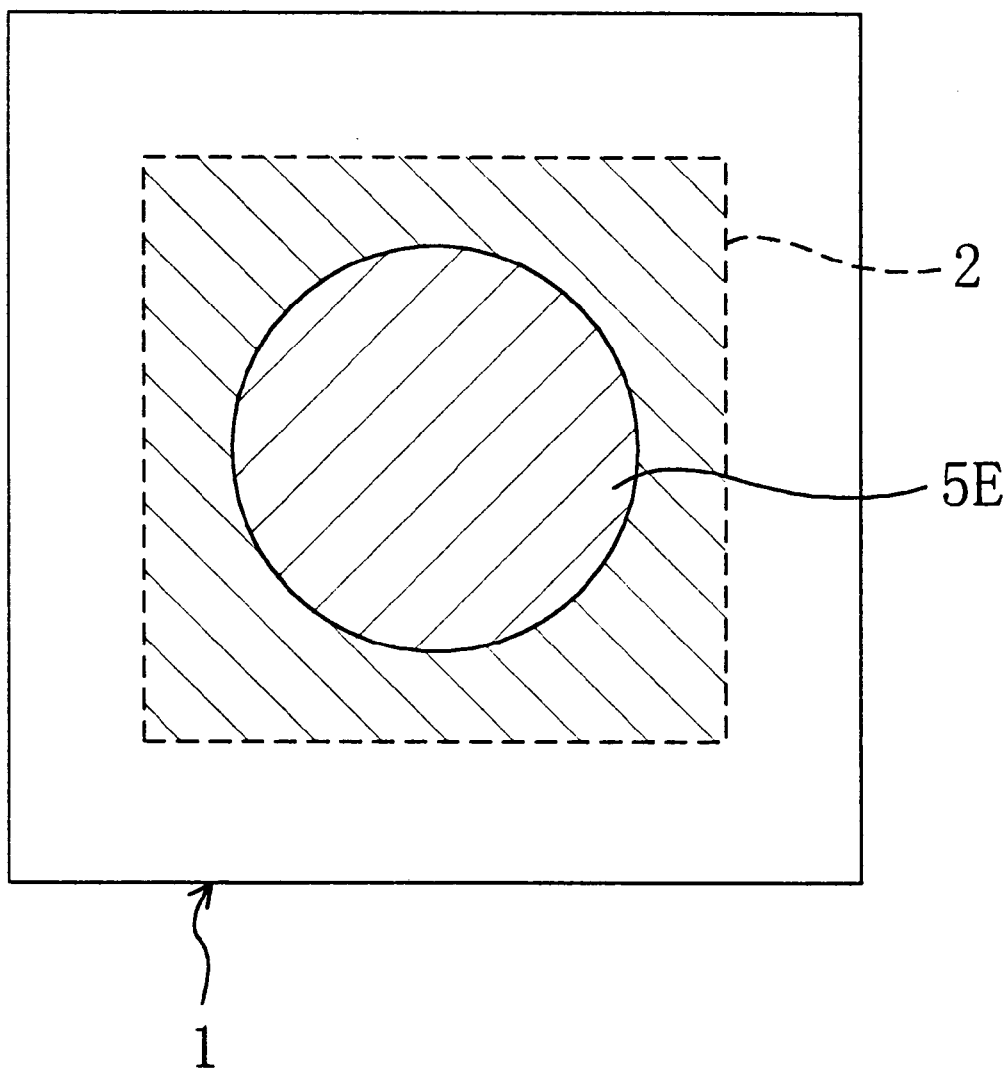
FIG. 12 is a plane view of an optical receiver in which a circular shield section is formed in the light receiving section surface.

In the foregoing embodiments, in the surface of the light receiving section 2 each first shield section 5, 5A, and 5B is formed in a latticelike pattern. Other patterns may be used. For example, a rectangular shield section 5D, shown in FIG. 11, may be used. Further, a circular shield section 5E, shown in FIG. 12, may be used. The thickness of the shield section is very thin for its area, and if the shield section area in the surface of the light receiving section 2 is the same, then almost the same photodetection sensitivity may be obtained, regardless of the shape. If the shield section is too thick for its area to neglect, it may be formed into a circular form as shown in FIG. 12, to have a greater circumferential length than any other shapes if they are identical in surface area. As a result, the area of contact with the light receiving section decreases, thereby achieving not only a reduction of the spontaneous noise amount but also an increase in the sensitivity of photodetection of optical receivers.

Both the light receiving section and the shield section are formed by diffusion. These sections may be formed using other processes such as implantation and epitaxial growth. Additionally, the shield section may be formed of a light-transmissive conductive film.

In the embodiments of the present invention, the description has been made in terms of photodiodes. The present invention may find applications in PIN type semiconductor photoelectric devices and avalanche type semiconductor photoelectric devices.

The invention claimed is:

1. An optical receiver comprising:

a semiconductor substrate of one conductivity type; and a light receiving section which is an impurity region formed on an upper surface of said semiconductor substrate, said light receiving section having an opposite conductivity type to that of said semiconductor substrate;

said optical receiver further comprising:

a first shield section which is a first impurity region of said one conductivity type formed on an upper surface of said light receiving section in such a way as to provide a partial covering of the upper surface of said light receiving section; and a second shield section which is a second impurity region of said one conductivity type formed around said light receiving section in such a way as to enclose almost all of the circumference of said light receiving section;

wherein said second shield section has a lateral shield portion formed to be deeper than said light receiving section.

2. The optical receiver according to claim 1, wherein the ratio of the area of said first shield section to the entire upper surface area of said light receiving section ranges from 0.40 to 0.60.

3. The optical receiver according to claim 1, wherein said first and second shield sections are electrically connected.

4. The optical receiver according to claim 3, wherein said first and second shield sections are integrally formed.

5. The optical receiver according to claim 1, wherein said lateral shield portion is formed in a sideface area of said semiconductor substrate.

6. The optical receiver according to claim 1 further comprising:

a contact layer which is an impurity region of said one conductive type formed in a lower surface area of said semiconductor substrate;

wherein almost all of the lower surface of said semiconductor substrate is bonded to a lead with a conductive adhesive.

7. The optical receiver according to claim 6, wherein a lower part of the sideface of said semiconductor substrate is covered with said conductive adhesive.

8. The optical receiver according to claim 7, wherein said contact layer is formed all over the lower surface of said semiconductor substrate and wherein the surface of said contact layer on the sideface of said semiconductor substrate is covered with said conductive adhesive.

9. The optical receiver according to claim 6, wherein said first and second shield section are electrically connected to each other, and an anode electrode connected to said lead is formed on said second shield section.

10. The optical receiver according to claim 1, wherein the shape of a region that is defined by said shield section in the upper surface of said light receiving section is circular.

* * * * *